United States Patent
Yamamoto (10) Patent No.: US 7,227,392 B2
(45) Date of Patent: Jun. 5, 2007

(54) FREQUENCY MULTIPLIER

(75) Inventor: Kazuya Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/298,591

(22) Filed: Dec. 12, 2005

(65) Prior Publication Data

US 2006/0152257 A1 Jul. 13, 2006

(30) Foreign Application Priority Data

Jan. 11, 2005 (JP) ............................. 2005-003667

(51) Int. Cl.
*H03B 19/00* (2006.01)

(52) U.S. Cl. ...................... 327/122; 327/116

(58) Field of Classification Search ................ 327/119, 327/122, 116, 113
See application file for complete search history.

(56) References Cited

U.S. PATENT DOCUMENTS

| | | | |
|---|---|---|---|
| 5,815,014 A * | 9/1998 | Zhang et al. | 327/122 |
| 6,100,731 A * | 8/2000 | Otaka | 327/119 |
| 6,882,191 B2 * | 4/2005 | Kwok | 327/122 |
| 2006/0145737 A1 * | 7/2006 | Yamamoto et al. | 327/119 |

FOREIGN PATENT DOCUMENTS

| | | |
|---|---|---|
| JP | 7-135424 | 5/1995 |
| JP | 2003-229722 | 8/2003 |
| JP | 2003-283251 | 10/2003 |

OTHER PUBLICATIONS

Yamamoto et al. "1.2/2.4GHz, 2.6/5.2-GHz-Band CMOS Frequency Doublers for Wireless Applications," Technical Report of the Institute of Electronics, Information and Communication Engineers, ED2003-210, pp. 25-30. JAPAN, no date.

* cited by examiner

*Primary Examiner*—Dinh T. Le
(74) *Attorney, Agent, or Firm*—Leydig, Voit & Mayer, Ltd.

(57) ABSTRACT

A multiplier core outputs a single-phase signal containing a frequency component having a frequency which is an even multiple of the frequency of an input signal. A differential amplifier includes first and second nMOS transistors having respective source terminals connected to each other. The output signal from the multiplier core is inputted to the gate terminal of the first nMOS transistor, and the gate terminal of the second nMOS transistor is AC grounded. The differential amplifier differentially amplifies the signals inputted to the gate terminals of the first and second nMOS transistors to output a potential at the drain terminals of the first and second nMOS transistors as a differential signal. The output terminal of the multiplier core is connected through a series LC circuit to the source terminals of the first and second nMOS transistors.

16 Claims, 8 Drawing Sheets

FREQUENCY MULTIPLIER

BACKGROUND OF THE INVENTION

1. Field of the Invention

The present invention relates to a frequency multiplier for outputting a signal whose principal frequency is an even multiple of the frequency of an input signal.

2. Description of the Background Art

A frequency multiplier is used in a radio system and the like to convert an RF signal outputted from a VCO (voltage-controlled oscillator) into a frequency which is a multiple of, e.g. twice, the frequency of the RF signal. In a radio system employing the frequency multiplier, there is a significant difference between the frequency of an RF signal outputted from a power amplifier after the frequency conversion and the frequency of an RF signal outputted from the VCO. This system has the advantage of being able to avoid a VCO pulling problem such that the oscillation frequency of the VCO is varied by the RF signal amplified by the power amplifier, as compared with a system which does not performs the frequency conversion on the RF signal.

Recent advantages in miniaturization technology have improved the operating frequency of CMOS devices. This makes it possible to integrate the VCO and the frequency multiplier onto an RF transceiver chip, and a large number of wireless LSIs are disclosed and commercialized. In such wireless LSIs, circuit blocks are required to operate at lower voltages because the miniaturization of the CMOS devices involves the reduction in gate breakdown voltage. For example, a CMOS device with a line width of 0.18 µm is generally required to operate at a power supply voltage of 1.8 V, and RF circuits included in the CMOS device accordingly must operate at a voltage of not greater than 1.8 V.

A configuration known as a Gilbert-cell has conventionally been used in the frequency multiplier, as disclosed also in Japanese Patent Application Laid-Open No. 2003-229722. This configuration, in which three transistors including a transistor constituting a constant current circuit are connected in series, presents a problem such that a sufficient output amplitude cannot be ensured when the power supply voltage is 1.8 V.

A frequency multiplier capable of lower-voltage operation at a power supply voltage of not greater than 1.8 V is proposed in Kazuya Yamamoto et al., "1.2/2.4-GHz, 2.6/5.2-GHz-Band CMOS Frequency Doublers for Wireless Applications," TECHNICAL REPORT OF THE INSTITUTE OF ELECTRONICS, INFORMATION AND COMMUNICATION ENGINEERS, ED2003-210, pp. 25–30. The frequency multiplier disclosed in the article by Kazuya Yamamoto et al. uses two MOS transistors having respective sources connected to each other and respective drains connected to each other as a multiplier core capable of outputting a frequency component having a frequency which is an even multiple of an input signal. Thus, the number of transistors connected in series is one, and the lower-voltage operation at the power supply voltage of 1.8 V is achieved.

Techniques about the frequency multiplier are also disclosed in Japanese Patent Application Laid-Open No. 7-135424 (1995) and Japanese Patent Application Laid-Open No. 2003-283251.

In the technique disclosed in the article by Kazuya Yamamoto et al., the multiplier core has a differential input, and complementary signals outputted from a VCO or the like provided in its preceding stage are inputted to the differential input. Sometimes, the complementary signals are not completely complementary to each other, in which case in-phase components are contained in the input signals to the multiplier core to cause an output signal from the multiplier core to contain a fundamental component having the same frequency as the input signals. The fundamental component is sometimes contained in the power supply potential of the multiplier core because the input signals enter a power supply line and the like. In such a case, the fundamental component is also contained in the output signal from the multiplier core.

The technique disclosed in the article by Kazuya Yamamoto et al. converts the differential input into a single-phase output by means of the multiplier core, and then converts the single-phase output into a differential output by means of a differential amplifier. If an unwanted fundamental component is contained in the output signal from the multiplier core as described above, this background art technique cannot remove the unwanted fundamental component to result in the increase in the ratio (fundamental wave suppression ratio) of the fundamental component to a necessary signal component, e.g. a frequency component whose frequency is twice the frequency of the input signals. This creates a problem such that the fundamental component is not sufficiently suppressed.

SUMMARY OF THE INVENTION

It is an object of the present invention to provide a frequency multiplier capable of improving the effect of suppressing an unwanted fundamental component.

According to a first aspect of the present invention, a frequency multiplier includes a multiplier core, a differential amplifier, and a series LC circuit. The multiplier core outputs a single-phase signal containing a frequency component whose principal frequency is an even multiple of the frequency of an input signal. The differential amplifier has a differential input terminal including a first input terminal receiving the output signal from the multiplier core, and an AC grounded second input terminal. The differential amplifier differentially amplifies signals inputted to the differential input terminal, to amplify the output signal from the multiplier core, thereby providing a differential output. The differential amplifier includes first and second transistors. Each of the first and second transistors has a first current terminal, a second current terminal and a control terminal. The second current terminals of the first and second transistors are connected to each other. The control terminal of the first transistor serves as the first input terminal of the differential input terminal. The control terminal of the second transistor serves as the second input terminal of the differential input terminal. The multiplier core has an output terminal connected through the series LC circuit to the second current terminals of the first and second transistors of the differential amplifier.

The output terminal of the multiplier core is connected through the series LC circuit to the second current terminals of the first and second transistors of the differential amplifier. If the output signal from the multiplier core contains an unwanted fundamental component having the same frequency as the input signal, the setting of the resonance frequency of the series LC circuit at a frequency equal to or close to the frequency of the input signal allows the input of the fundamental component to the second terminals of the first and second transistors through the series LC circuit. As a result, the fundamental component inputted to the control terminal of the first transistor can be cancelled by the fundamental component inputted to the second current terminals of the first and second transistors. This suppresses the unwanted fundamental component appearing in the output signal from the differential amplifier.

According to a second aspect of the present invention, a frequency multiplier includes a multiplier core, a differential amplifier, and a series LC circuit. The multiplier core outputs a single-phase signal containing a frequency component whose principal frequency is an even multiple of the frequency of an input signal. The multiplier core includes first and second transistors. Each of the first and second transistors has a first current terminal, a second current terminal and a control terminal. The differential amplifier has a differential input terminal including a first input terminal receiving the output signal from the multiplier core, and an AC grounded second input terminal. The differential amplifier differentially amplifies signals inputted to the differential input terminal, to amplify the output signal from the multiplier core, thereby providing a differential output. The first current terminals of the first and second transistors of the multiplier core are connected to each other. The second current terminals of the first and second transistors of the multiplier core are connected to each other. The first current terminals of the first and second transistors of the multiplier core are connected through a first resistance element to a power supply potential. The second current terminals of the first and second transistors of the multiplier core are connected through a second resistance element to a ground potential. The multiplier core outputs a potential at the first current terminals of the first and second transistors. The second current terminals of the first and second transistors of the multiplier core are connected through the series LC circuit to the first input terminal of the differentia input terminal.

The second current terminals of the first and second transistors of the multiplier core are connected through the series LC circuit to the first input terminal of the differentia input terminal. In the multiplier core, the signal appearing at the first current terminals of the first and second transistors and the signal appearing at the second current terminals thereof have opposite phases. If the output signal from the multiplier core contains an unwanted fundamental component having the same frequency as the input signal, the setting of the resonance frequency of the series LC circuit at a frequency equal to or close to the frequency of the input signal allows the input of the signal opposite in phase to the fundamental component to the first input terminal of the differential amplifier through the series LC circuit. As a result, the fundamental component contained in the output signal from the multiplier core is cancelled at the first input terminal of the differential amplifier by the signal opposite in phase thereto and outputted from the series LC circuit. This suppresses the unwanted fundamental component appearing in the output signal from the differential amplifier.

According to a third aspect of the present invention, a frequency multiplier includes a multiplier core, a 90-degree phase shifter, and a differential amplifier. The multiplier core outputs a single-phase signal containing a frequency component whose principal frequency is an even multiple of the frequency of an input signal. The 90-degree phase shifter distributes the output signal from the multiplier core into two to output a first signal and a second signal. The differential amplifier has a differential input terminal including a first input terminal receiving the first signal, and a second input terminal receiving the second signal. The differential amplifier differentially amplifies the signals inputted to the differential input terminal to provide a differential output. The 90-degree phase shifter distributes the frequency component contained in the output signal from the multiplier core into two signals having opposite phases, and distributes a component other than the frequency component contained in the output signal from the multiplier core into two signals having the same phase.

The frequency component contained in the output signal from the multiplier core and having a frequency which is an even multiple of the frequency of the input signal is distributed into the two signals having opposite phases which in turn are outputted to the differential amplifier. Other frequency components contained in the output signal are distributed into the two signals having the same phase which in turn are outputted to the differential amplifier. If the output signal from the multiplier core contains an unwanted fundamental component having the same frequency as the input signal, the differential amplifier can cancel the in-phase fundamental components inputted thereto, and properly amplify the opposite-phase frequency components inputted thereto and having the frequency which is an even multiple of the frequency of the input signal. This suppresses the unwanted fundamental component appearing in the output signal from the differential amplifier.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
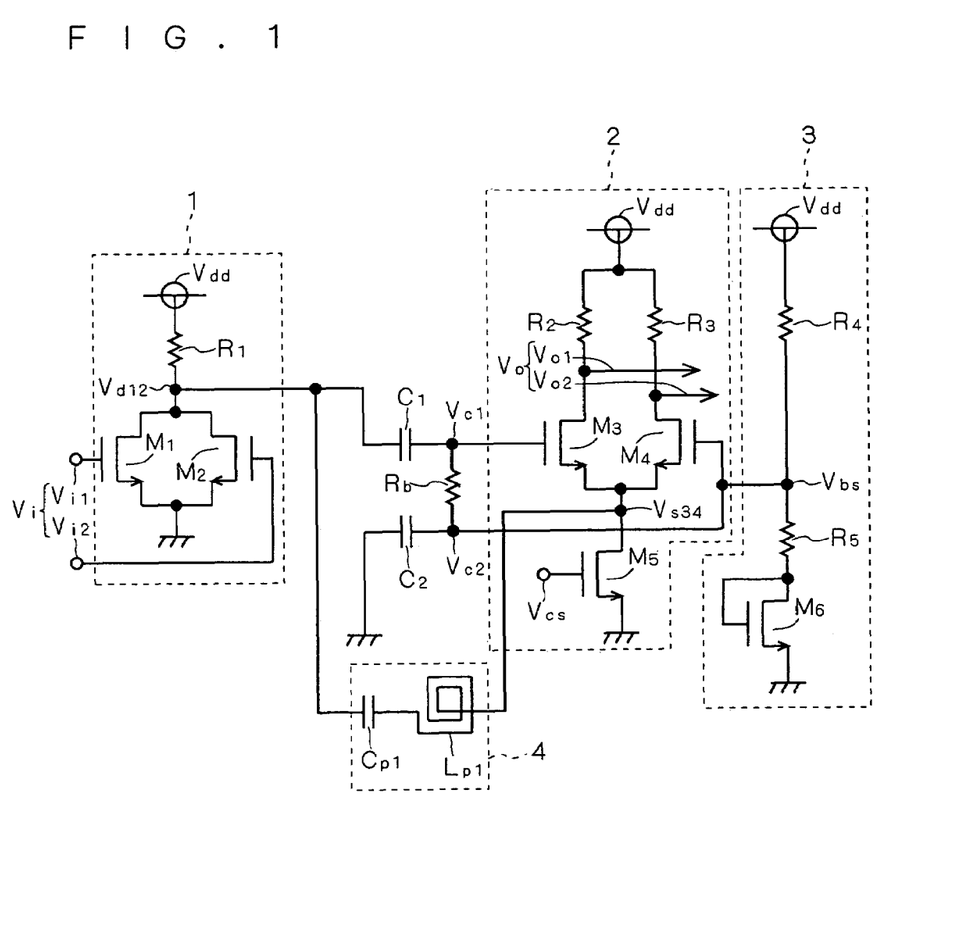
FIG. 1 is a circuit diagram showing a configuration of a frequency multiplier according to a first preferred embodiment of the present invention.

FIG. 1 is a circuit diagram showing a configuration of a frequency multiplier according to a first preferred embodiment of the present invention. The frequency multiplier according to the first preferred embodiment is capable of outputting a signal whose frequency is an even multiple of, for example twice, the frequency of an input signal.

As shown in FIG. 1, the frequency multiplier according to the first preferred embodiment includes a multiplier core 1 for outputting a signal containing a frequency component whose principal frequency is an even multiple of the frequency of a differential input signal $V_i$, a differential amplifier 2 for amplifying the output signal from the multiplier core 1 to provide a differential output, a bias circuit 3 for applying a bias potential $V_{bs}$ to the differential amplifier 2, a series LC circuit 4, capacitance elements $C_1$ and $C_2$, and a resistance element $R_b$.

The multiplier core 1 includes a resistance element $R_1$, and nMOS transistors $M_1$ and $M_2$. The drain terminal serving as a first current terminal of the nMOS transistor $M_1$ and the drain terminal serving as a first current terminal of the nMOS transistor $M_2$ are connected to each other. The drain terminals of the nMOS transistors $M_1$ and $M_2$ are connected through the resistance element $R_1$ to a power supply potential $V_{dd}$. The source terminal serving as a second current terminal of the nMOS transistor $M_1$ and the source terminal serving as a second current terminal of the nMOS transistor $M_2$ are connected to each other. The source terminals of the nMOS transistors $M_1$ and $M_2$ are connected to a ground potential.

A first input signal $V_{i1}$ contained in the differential input signal $V_i$ is inputted to the gate terminal serving as the control terminal of the nMOS transistor $M_1$, and a second input signal $V_{i2}$ contained in the differential input signal $V_i$ is inputted to the gate terminal serving as the control terminal of the nMOS transistor $M_2$. The multiplier core 1 outputs a potential at the drain terminals of the nMOS transistors $M_1$ and $M_2$ as an output signal $V_{d12}$ to the differential amplifier 2. The first and second input signals $V_{i1}$ and $V_{i2}$ are outputted from a VCO and the like, and are complementary signals having opposite phases.

In the multiplier core 1 having the above-mentioned configuration, a bias circuit not shown previously applies a bias close to a pinch-off voltage between the gate and source terminals of each of the nMOS transistors $M_1$ and $M_2$ or previously applies a bias so that the drain current of each of the nMOS transistors $M_1$ and $M_2$ is relatively low. In such a state, when the first and second input signals $V_{i1}$ and $V_{i2}$ are inputted to the gate terminals of the nMOS transistors $M_1$ and $M_2$ respectively, the first and second input signals $V_{i1}$ and $V_{i2}$ appear as distorted signals at the drain terminals of the nMOS transistors $M_1$ and $M_2$. At the drain terminals of the nMOS transistors $M_1$ and $M_2$, fundamental components and odd-multiple components contained in the distorted first and second input signals $V_{i1}$ and $V_{i2}$ appear in opposite phase and are cancelled, and even-multiple components appear in phase with each other and are extracted as the output signal $V_{d12}$ from the multiplier core 1.

The term "fundamental component" used herein refers to a frequency component having a frequency equal to the frequency of the yet-to-be-distorted first and second input signals $V_{i1}$ and $V_{i2}$ inputted to the multiplier core 1. The term "odd-multiple component" used herein refers to a frequency component having a frequency which is an odd multiple of the frequency of the first and second input signals $V_{i1}$ and $V_{i2}$. The term "even-multiple component" used herein refers to a frequency component having a frequency which is an even multiple of the frequency of the first and second input signals $V_{i1}$ and $V_{i2}$.

Thus, the multiplier core 1 according to the first preferred embodiment is capable of outputting the output signal $V_{d12}$ containing the even-multiple components of the first and second input signals $V_{i1}$ and $V_{i2}$ to the differential amplifier 2 provided in the following stage.

Of the even-multiple components contained in the output signal $V_{d12}$ from the multiplier core 1, a frequency component (referred to hereinafter as a "second harmonic component") having a frequency which is twice the frequency of the first and second input signals $V_{i1}$ and $V_{i2}$ is at the highest signal level. The signal level of the harmonic component decreases as the order thereof increases. According to the first preferred embodiment, the second harmonic component is finally outputted from the differential amplifier 2.

The differential amplifier 2 includes resistance elements $R_2$ and $R_3$, and nMOS transistors $M_3$, $M_4$ and $M_5$. The source terminal of the nMOS transistor $M_3$ and the source terminal of the nMOS transistor $M_4$ are connected to each other. The source terminals of the nMOS transistors $M_3$ and $M_4$ are connected to the drain terminal of the nMOS transistor $M_5$ functioning as a constant current circuit. The source terminal of the nMOS transistor $M_5$ is connected to the ground potential. A control signal $V_{CS}$ is inputted to the gate terminal of the nMOS transistor $M_5$.

The gate terminal of the nMOS transistor $M_3$ is connected through the capacitance element $C_1$ to the drain terminals of the nMOS transistors $M_1$ and $M_2$ of the multiplier core 1. Thus, only an AC component of the output signal $V_{d12}$ from the multiplier core 1 is inputted to the gate terminal of the nMOS transistor $M_3$. The bias potential $V_{bs}$ from the bias circuit 3 is applied to the gate terminal of the nMOS transistor $M_3$ through the resistance element $R_b$.

The gate terminal of the nMOS transistor $M_4$ is connected through the capacitance element $C_2$ to the ground potential. Thus, the gate terminal of the nMOS transistor $M_4$ is AC grounded. The bias potential $V_{bs}$ from the bias circuit 3 is applied to the gate terminal of the nMOS transistor $M_4$.

The gate terminals of the nMOS transistors $M_3$ and $M_4$ are connected to each other through the resistance element $R_b$. However, because the resistance value of the resistance element $R_b$ is set at a high level, the output signal $V_{d12}$ from the multiplier core 1 is not applied to the gate terminal of the nMOS transistor $M_4$.

The drain terminal of the nMOS transistor $M_3$ is connected through the resistance element $R_2$ to the power supply potential $V_{dd}$. The drain terminal of the nMOS transistor $M_4$ is connected through the resistance element $R_3$ to the power supply potential $V_{dd}$. The differential amplifier 2 outputs the drain potential of the nMOS transistor $M_3$ as a first output signal $V_{o1}$ contained in a differential output signal $V_o$, and outputs the drain potential of the nMOS transistor $M_4$ as a second output signal $V_{o2}$ contained in the differential output signal $V_o$.

The gate terminals of the nMOS transistors $M_3$ and $M_4$ function as a differential input terminal for the differential amplifier 2 having the above-mentioned configuration. The differential amplifier 2 differentially amplifies the gate potential $V_{c1}$ of the nMOS transistor $M_3$ and the gate potential $V_{c2}$ of the nMOS transistor $M_4$. As a result, the differential amplifier 2 amplifies the output signal $V_{d12}$ from the multiplier core 1 to output the first output signal $V_{o1}$ opposite in phase to the output signal $V_{d12}$, and also amplifies the output signal $V_{d12}$ to output the second output signal $V_{o2}$ in phase with the output signal $V_{d12}$. Thus, the output signals $V_{o1}$ and $V_{o2}$ are complementary signals having opposite phases.

The higher the frequency of the input signal is, the lower an amplification factor is in the differential amplifier 2 according to the first preferred embodiment. For this reason, the differential amplifier 2 outputs few components other than the second harmonic component among the even-multiple components contained in the output signal $V_{d12}$ from the multiplier core 1. Therefore, only a signal having a frequency which is twice the frequency of the differential input signal $V_i$ is extracted from the differential amplifier 2.

The bias circuit 3 includes resistance elements $R_4$ and $R_5$, and an nMOS transistor $M_6$. The resistance elements $R_4$ and $R_5$ are connected in series with each other. The drain terminal of the nMOS transistor $M_6$ is connected through the series-connected resistance elements $R_4$ and $R_5$ to the power supply potential $V_{dd}$. The drain and gate terminals of the nMOS transistor $M_6$ are connected to each other, and the source terminal of the nMOS transistor $M_6$ is connected to the ground potential. The bias circuit 3 outputs a potential at a point of connection between the resistance element $R_4$ and the resistance element $R_5$ as the bias potential $V_{bs}$ to the differential amplifier 2.

The series LC circuit 4 includes a capacitance element $C_{p1}$ and an inductor element $L_{p1}$ which are connected in series with each other. The resonance frequency of the series LC circuit 4 is equal to or close to the frequency of the fundamental component, that is, the frequency of the first and second input signals $V_{i1}$ and $V_{i2}$ to the multiplier core 1. The capacitance element $C_{p1}$ has a first end connected to the drain terminals of the nMOS transistors $M_1$ and $M_2$, and a second end connected to a first end of the inductor element $L_{p1}$. The inductor element $L_{p1}$, has a second end connected to the source terminals of the nMOS transistors $M_3$ and $M_4$.

Thus, the output terminal of the multiplier core 1, i.e. the drain terminals of the nMOS transistors $M_1$ and $M_2$, and the source terminals of the nMOS transistors $M_3$ and $M_4$ of the differential amplifier 2 are connected through the series LC circuit 4.

In the frequency multiplier having the above-mentioned circuit configuration according to the first preferred embodiment, the single-phase output signal $V_{d12}$ containing the even-multiple component and outputted from the multiplier core 1 is amplified by the differential amplifier 2 which in turn provides the differential output. Because the amplification factor decreases with the increase in the frequency of the input signal in the differential amplifier 2, only the second harmonic component is outputted from the differential amplifier 2.

As described above, the drain terminals of the nMOS transistors $M_1$ and $M_2$ serving as the output terminal of the multiplier core 1 are connected through the series LC circuit 4 to the source terminals of the nMOS transistors $M_3$ and $M_4$ of the differential amplifier 2 in the frequency multiplier according to the first preferred embodiment. Therefore, if the fundamental component is contained in the output signal $V_{d12}$ due to the first and second input signals $V_{i1}$ and $V_{i2}$ containing in-phase components or due to the first and second input signals $V_{i1}$ and $V_{i2}$ entering a power supply line and the like, the setting of the resonance frequency of the series LC circuit 4 at a frequency equal to or close to the frequency of the first and second input signals $V_{i1}$ and $V_{i2}$ allows the input of the fundamental component to the source terminals of the nMOS transistors $M_3$ and $M_4$ through the series LC circuit 4, as in the first preferred embodiment. That is, the fundamental component is contained in the source potential $V_{s34}$ of the nMOS transistors $M_3$ and $M_4$. As a result, the fundamental component inputted to the gate terminal of the nMOS transistor $M_3$ can be cancelled by the fundamental component inputted to the source terminals of the nMOS transistors $M_3$ and $M_4$. This suppresses an unwanted fundamental component appearing in the output signals $V_{o1}$ and $V_{o2}$ from the differential amplifier 2.

Because the bias potential $V_{bs}$ outputted from the bias circuit 3 is generated from the power supply potential $V_{dd}$, the fundamental component is also contained in the bias potential $V_{bs}$ if the power supply potential $V_{dd}$ contains the fundamental component due to the first and second input signals $V_{i1}$ and $V_{i2}$ entering the power supply line and the like. Then, the fundamental component contained in the bias potential $V_{bs}$ is inputted to the gate terminals of the nMOS transistors $M_3$ and $M_4$ because the bias potential $V_{bs}$ is applied to the gate terminals of the nMOS transistors $M_3$ and $M_4$ of the differential amplifier 2.

In the first preferred embodiment as shown in FIG. 1, the circuit configuration of a first path for connecting the bias potential $V_{bs}$ to the gate terminal of the nMOS transistor $M_3$ differs from the circuit configuration of a second path for connecting the bias potential $V_{bs}$ to the gate terminal of the nMOS transistor $M_4$ in that the circuit configuration of the first path is composed of lines and the resistance element $R_b$ whereas the circuit configuration of the second path is composed of only lines. Thus, there is a difference in impedance between the first and second paths, to result in slightly different phases of the fundamental component contained in the bias potential $V_{bs}$ which are inputted to the gate terminals of the nMOS transistors $M_3$ and $M_4$, respectively. The fundamental component inputted to the differential input terminal of the differential amplifier 2 by way of the bias circuit 3 among the fundamental components contained in the power supply potential $V_{dd}$ is not completely removed. Because of this influence, the fundamental component sometimes appears in the output signals from the differential amplifier 2.

If the resonance frequency of the series LC circuit 4 is set at a frequency equal to or close to the frequency of the first and second input signals $V_{i1}$ and $V_{i2}$, the necessary second harmonic component slightly passes through the series LC circuit 4, and is inputted to the source terminals of the nMOS transistors $M_3$ and $M_4$. This might decrease the amplification factor for the second harmonic component in the differential amplifier 2.

To solve the problem, a variable capacitance element is used as the capacitance element $C_{p1}$ of the series LC circuit 4. Varying the value of the variable capacitance element allows the adjustment of the resonance frequency of the series LC circuit 4, thereby adjusting the amount of the fundamental component and second harmonic component inputted to the source terminals of the nMOS transistors $M_3$ and $M_4$. This achieves the suppression of the decrease in the amplification factor of the second harmonic component while removing the unwanted fundamental component to some degree.

Figure 2:
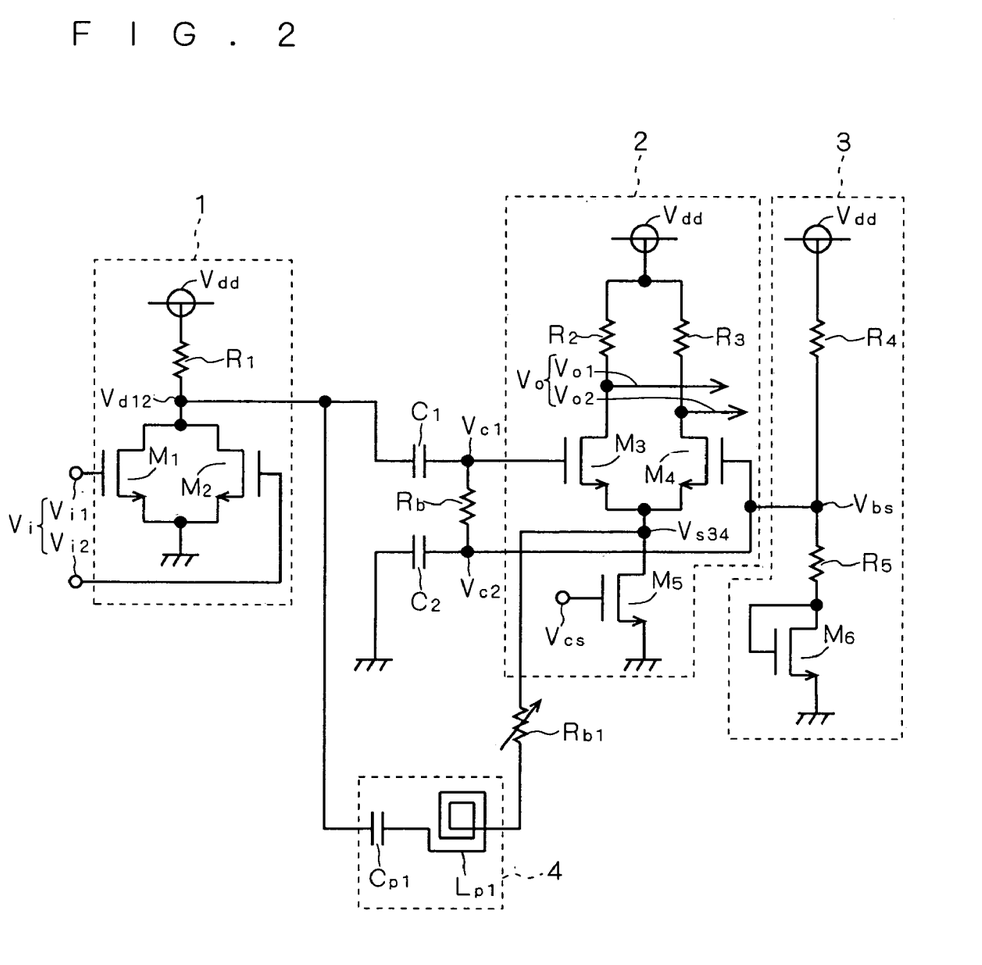
FIG. 2 is a circuit diagram showing a modification of the configuration of the frequency multiplier according to the first preferred embodiment.

In place of or in addition to the variable capacitance element used as the capacitance element $C_{p1}$, a variable resistance element $R_{b1}$ composed of an nMOS transistor and the like may be used in such a manner that the output terminal of the multiplier core 1 and the source terminals of the nMOS transistors $M_3$ and $M_4$ of the differential amplifier 2 are connected not only through the series LC circuit 4 but also through the variable resistance element $R_{b1}$, as shown in FIG. 2. In this case, the series LC circuit 4 and the variable resistance element $R_{b1}$ are connected in series with each other, and the amount of the fundamental component and second harmonic component inputted to the source terminals of the nMOS transistors $M_3$ and $M_4$ is adjusted by varying the value of the variable resistance element $R_{b1}$. This achieves the suppression of the decrease in the amplification factor of the second harmonic component while removing the unwanted fundamental component to some degree.

Second Preferred Embodiment

Figure 3:
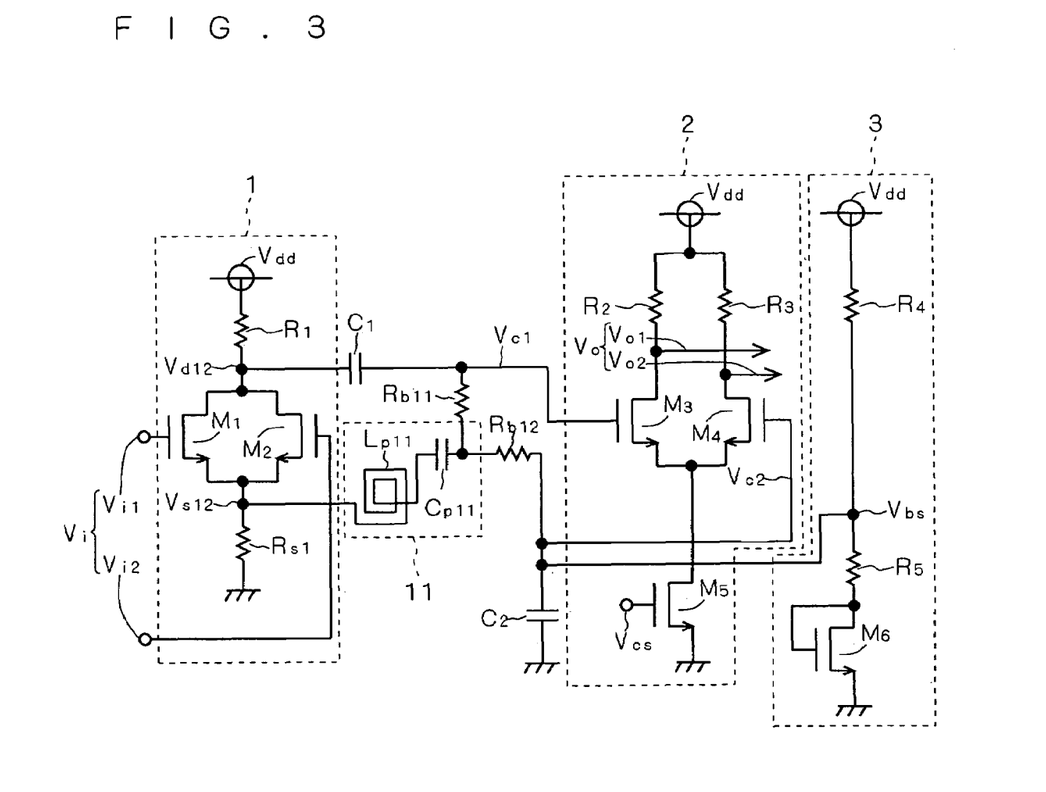
FIG. 3 is a circuit diagram showing a configuration of the frequency multiplier according to a second preferred embodiment of the present invention.

FIG. 3 is a circuit diagram showing a configuration of the frequency multiplier according to a second preferred embodiment of the present invention. As shown in FIG. 3, the frequency multiplier according to the second preferred embodiment includes the multiplier core 1, the differential amplifier 2, the bias circuit 3, the capacitance elements $C_1$ and $C_2$, a series LC circuit 11, and resistance elements $R_{b11}$ and $R_{b12}$. In the multiplier core 1 according to the second preferred embodiment, the source terminals of the nMOS transistors $M_1$ and $M_2$ are connected through a resistance element $R_{s1}$ to the ground potential.

The series LC circuit 11 includes an inductor element $L_{p11}$ and a capacitance element $C_{p11}$ which are connected in series with each other. The resonance frequency of the series LC circuit 11 is equal to or close to the frequency of the first and second input signals $V_{i1}$ and $V_{i2}$. The inductor element $L_{p11}$ has a first end connected to the source terminals of the nMOS transistors $M_1$ and $M_2$, and a second end connected to a first end of the capacitance element $C_{p11}$. The capacitance element $C_{p11}$ has a second end connected to a first end of the resistance element $R_{b11}$. The resistance element $R_{b11}$ has a second end connected to the gate terminal of the nMOS transistor $M_3$.

Thus, the source terminals of the nMOS transistors $M_1$ and $M_2$ of the multiplier core 1, and the gate terminal of the nMOS transistor $M_3$ of the differential amplifier 2 are connected through the series LC circuit 11 and the resistance element $R_{b11}$.

As in the first preferred embodiment, the gate terminal of the nMOS transistor $M_3$ of the differential amplifier 2 is connected through the capacitance element $C_1$ to the drain terminals of the nMOS transistors $M_1$ and $M_2$ of the multiplier core 1, and the gate terminal of the nMOS transistor $M_4$ is connected through the capacitance element $C_2$ to the ground potential. Thus, the gate terminal of the nMOS transistor $M_4$ is AC grounded. The bias potential $V_{bs}$ from the bias circuit 3 is applied to the gate terminal of the nMOS transistor $M_3$ through the resistance elements $R_{b11}$ and $R_{b12}$. The bias potential $V_{bs}$ from the bias circuit 3 is applied directly to the gate terminal of the nMOS transistor $M_4$.

The gate terminals of the nMOS transistors $M_3$ and $M_4$ are connected to each other through the resistance elements $R_{b11}$ and $R_{b12}$. However, because the resistance value of the resistance element $R_{b12}$ is set at a high level, the output signal $V_{d12}$ from the multiplier core 1 is not applied to the gate terminal of the nMOS transistor $M_4$.

As described above, the source terminals of the nMOS transistors $M_1$ and $M_2$ of the multiplier core 1 are connected through the series LC circuit 11 to the gate terminal of the nMOS transistor $M_3$ of the differential amplifier 2 in the frequency multiplier according to the second preferred embodiment. In the multiplier core 1 according to the second preferred embodiment, the signal appearing at the drain terminals of the nMOS transistors $M_1$ and $M_2$ and the signal appearing at the source terminals thereof have opposite phases. Therefore, the setting of the resonance frequency of the series LC circuit 11 at a frequency equal to or close to the frequency of the first and second input signals $V_{i1}$ and $V_{i2}$ allows the input of the signal opposite in phase to the fundamental component contained in the output signal $V_{d12}$ to the gate terminal of the nMOS transistor $M_3$ through the series LC circuit 11. As a result, the fundamental component contained in the output signal $V_{d12}$ at the gate terminal of the nMOS transistor $M_3$ is cancelled by the signal opposite in phase thereto and outputted from the series LC circuit 11. This suppresses the unwanted fundamental component appearing in the output signals $V_{o1}$ and $V_{o2}$ from the differential amplifier 2.

In the frequency multiplier according to the second preferred embodiment, the circuit configuration of the first path for connecting the bias potential $V_{bs}$ to the gate terminal of the nMOS transistor $M_3$ differs from the circuit configuration of the second path for connecting the bias potential $V_{bs}$ to the gate terminal of the nMOS transistor $M_4$ in that the circuit configuration of the first path is composed of lines and the resistance elements $R_{b11}$ and $R_{b12}$ whereas the circuit configuration of the second path is composed of only lines. Thus, there is a difference in impedance between the first and second paths, as in the frequency multiplier according to the first preferred embodiment. The fundamental component inputted to the differential input terminal of the differential amplifier 2 by way of the bias circuit 3 among the fundamental components contained in the power supply potential $V_{dd}$ is not completely removed. Because of this influence, the fundamental component sometimes appears in the output signals from the differential amplifier 2.

In the second preferred embodiment, the source terminals of the nMOS transistors $M_1$ and $M_2$ of the multiplier core 1 and the gate terminal of the nMOS transistor $M_3$ of the differential amplifier 2 are connected not only through the series LC circuit 11 but also through the resistance element $R_{b11}$. The resistance element $R_{b11}$ is provided to adjust the amount of input of the signal opposite in phase to the fundamental component to the gate terminal of the nMOS transistor $M_3$. If such adjustment is not required, the source terminals of the nMOS transistors $M_1$ and $M_2$ and the gate terminal of the nMOS transistor $M_3$ of the differential amplifier 2 may be connected only through the series LC circuit 11.

If the resonance frequency of the series LC circuit 11 is set at a frequency equal to or close to the frequency of the first and second input signals $V_{i1}$ and $V_{i2}$, the signal opposite in phase to the necessary second harmonic component slightly passes through the series LC circuit 11, and is inputted to the gate terminal of the nMOS transistor $M_3$, also in the second preferred embodiment. This might decrease the amplification factor for the second harmonic component in the differential amplifier 2.

To solve the problem, a variable resistance element including an nMOS transistor and the like is used as the resistance element $R_{b11}$. Varying the value of the variable resistance element allows the adjustment of the amount of the signal opposite in phase to the fundamental and second harmonic components which is inputted to the gate terminal of the nMOS transistor $M_3$. This achieves the suppression of the decrease in the amplification factor of the second harmonic component while removing the unwanted fundamental component to some degree.

In place of or in addition to the variable resistance element used as the resistance element $R_{b11}$, a variable capacitance element may be used as the capacitance element $C_{p11}$ of the series LC circuit 11. In this case, the resonance frequency of the series LC circuit 11 is adjusted by varying the value of the variable capacitance element. This achieves the adjustment of the amount of the signal opposite in phase to the fundamental and second harmonic components which is inputted to the gate terminal of the nMOS transistor $M_3$, thereby to suppress the decrease in the amplification factor of the second harmonic component while removing the unwanted fundamental component to some degree.

Third Preferred Embodiment

Figure 4:
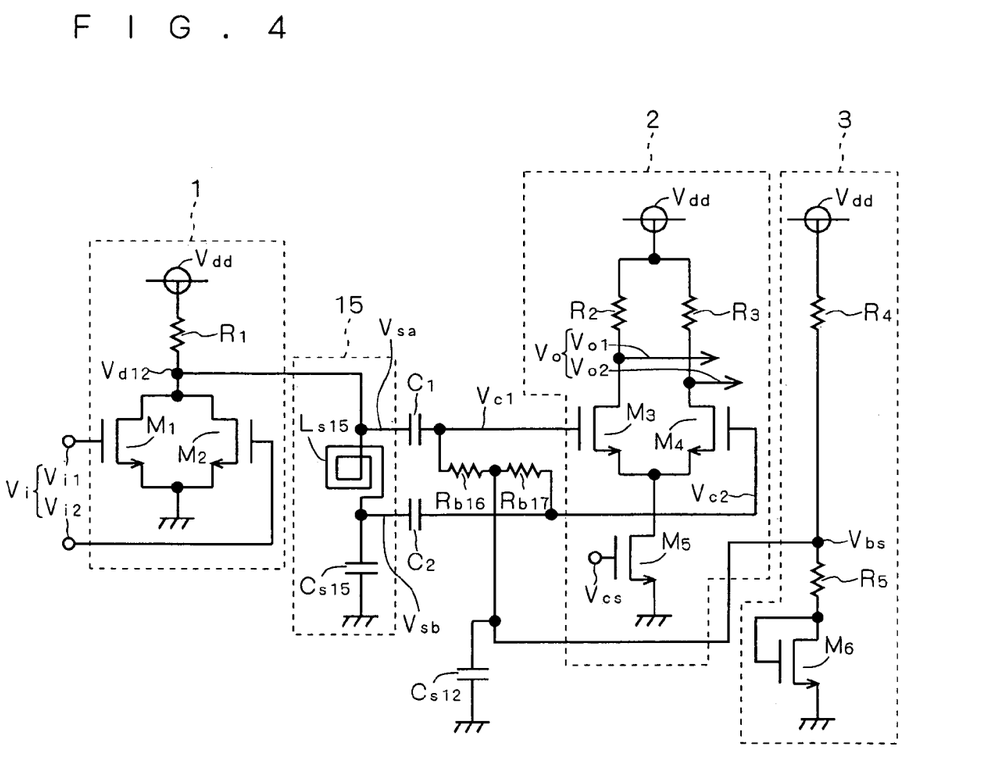
FIG. 4 is a circuit diagram showing a configuration of the frequency multiplier according to a third preferred embodiment of the present invention.

FIG. 4 is a circuit diagram showing a configuration of the frequency multiplier according to a third preferred embodiment of the present invention. As shown in FIG. 4, the frequency multiplier according to the third preferred embodiment includes the multiplier core 1, the differential amplifier 2, the bias circuit 3, the capacitance elements $C_1$ and $C_2$, a 90-degree phase shifter 15, resistance elements $R_{b16}$ and $R_{b17}$, and a capacitance element $C_{s12}$.

The 90-degree phase shifter 15 includes an inductor element $L_{s15}$ and a capacitance element $C_{s15}$, and distributes the output signal $V_{d12}$ outputted from the multiplier core 1 into two distributed signals $V_{sa}$ and $V_{sb}$. The inductor element $L_{s15}$ has a first end connected to the drain terminals of the nMOS transistors $M_1$ and $M_2$ of the multiplier core 1 and to a first end of the capacitance element $C_1$, and a second end connected to a first end of the capacitance element $C_{s15}$ and to a first end of the capacitance element $C_2$. The capacitance element $C_{s15}$ has a second end connected to the ground potential. The capacitance element $C_2$ has a second end connected to the gate terminal of the nMOS transistor $M_4$ of the differential amplifier 2. The capacitance element $C_1$ has a second end connected to the gate terminal of the nMOS transistor $M_3$.

In the 90-degree phase shifter 15 according to the third preferred embodiment, the resonance frequency of a series LC circuit composed of the inductor element $L_{s15}$ and the capacitance element $C_{s15}$ is set at a frequency equal to the frequency of the second harmonic component, that is, at a frequency which is twice the frequency of the first and second input signals $V_{i1}$ and $V_{i2}$. Among the frequency components contained in the output signal $V_{d12}$, the second harmonic component is distributed into and outputted as the two distributed signals $V_{sa}$ and $V_{sb}$ having opposite phases, and other frequency components are distributed into and outputted as the two distributed signals $V_{sa}$ and $V_{sb}$ having the same phase. The distributed signal $V_{sa}$ outputted from the 90-degree phase shifter 15 is inputted to the gate terminal of the nMOS transistor $M_3$ through the capacitance element $C_1$, and the distributed signal $V_{sb}$ is inputted to the gate terminal of the nMOS transistor $M_4$ through the capacitance element $C_2$.

The bias potential $V_{bs}$ from the bias circuit 3 is applied to the gate terminal of the nMOS transistor $M_3$ of the differential amplifier 2 through the resistance element $R_{b16}$. The bias potential $V_{bs}$ from the bias circuit 3 is applied to the gate terminal of the nMOS transistor $M_4$ through the resistance element $R_{b17}$. The differential amplifier 2 differentially amplifies the distributed signals $V_{sa}$ and $V_{sb}$ outputted from the 90-degree phase shifter 15 to output the result of amplification as the output signals $V_{o1}$ and $V_{o2}$.

The capacitance element $C_{s12}$ is provided to prevent variations in the bias potential $V_{bs}$. The capacitance element $C_{s12}$ has a first end connected to a point of connection between the resistance elements $R_{b16}$ and $R_{b17}$ and to a point of connection between the resistance elements $R_4$ and $R_5$, and a second end grounded.

The gate terminals of the nMOS transistors $M_3$ and $M_4$ are connected to each other through the resistance elements $R_{b16}$ and $R_{b17}$. However, because the resistance values of the resistance elements $R_{b16}$ and $R_{b17}$ are set at a high level, the distributed signal $V_{sa}$ is not applied to the gate terminal of the nMOS transistor $M_4$, and the distributed signal $V_{sb}$ is not applied to the gate terminal of the nMOS transistor $M_3$.

In the frequency multiplier according to the third preferred embodiment as described above, the second harmonic component contained in the output signal $V_{d12}$ is distributed into the two signals having opposite phases which in turn are outputted to the differential amplifier 2 whereas other frequency components contained in the output signal $V_{d12}$ are distributed into the two signals having the same phase which in turn are outputted to the differential amplifier 2. If an unwanted fundamental component is contained in the output signal $V_{d12}$ from the multiplier core 1, the fundamental component inputted to a first input terminal of the differential amplifier 2 is in phase with the fundamental component inputted to a second input terminal of the differential amplifier 2. Thus, the differential amplifier 2 can cancel the in-phase fundamental components inputted thereto, and properly amplify the second harmonic component inputted to the first input terminal thereof and the second harmonic component inputted to the second input terminal thereof which are opposite in phase to each other. This suppresses the unwanted fundamental component appearing in the output signals $V_{o1}$ and $V_{o2}$ from the differential amplifier 2.

In the frequency multiplier according to the third preferred embodiment, the circuit configuration of the first path for connecting the bias potential $V_{bs}$ to the gate terminal of the nMOS transistor $M_3$ is composed of the capacitance element $C_{s12}$, the resistance element $R_{b16}$ and lines, and the circuit configuration of the second path for connecting the bias potential $V_{bs}$ to the gate terminal of the nMOS transistor $M_4$ is composed of the capacitance element $C_{s12}$, the resistance element $R_{b17}$ and lines. Thus, the circuit configurations of the first and second paths are identical with each other, and the impedances of the first and second paths can approach each other. This reduces the phase difference between the fundamental component inputted to the gate terminal of the nMOS transistor $M_3$ and the fundamental component inputted to the gate terminal of the nMOS transistor $M_4$ due to the fundamental component contained in the bias potential $V_{bs}$. Therefore, the frequency multiplier according to the third preferred embodiment more reliably removes the fundamental component inputted to the differential input terminal of the differential amplifier 2 by way of the bias circuit 3 among the fundamental components contained in the power supply potential $V_{dd}$ than the frequency multipliers of the first and second preferred embodiments, thereby to further suppress the fundamental component appearing in the output signals from the differential amplifier 2.

In the above-mentioned first and second preferred embodiments, the circuit configuration of the first path for connecting the bias potential $V_{bs}$ to the gate terminal of the nMOS transistor $M_3$ and the circuit configuration of the second path for connecting the bias potential $V_{bs}$ to the gate terminal of the nMOS transistor $M_4$ may be made identical with each other as in the third preferred embodiment. This enables the first and second preferred embodiments to further remove the fundamental component inputted to the differential input terminal of the differential amplifier 2 due to the fundamental component contained in the bias potential $V_{bs}$, thereby further suppressing the fundamental component appearing in the output signals from the differential amplifier 2.

Fourth Preferred Embodiment

Figure 5:
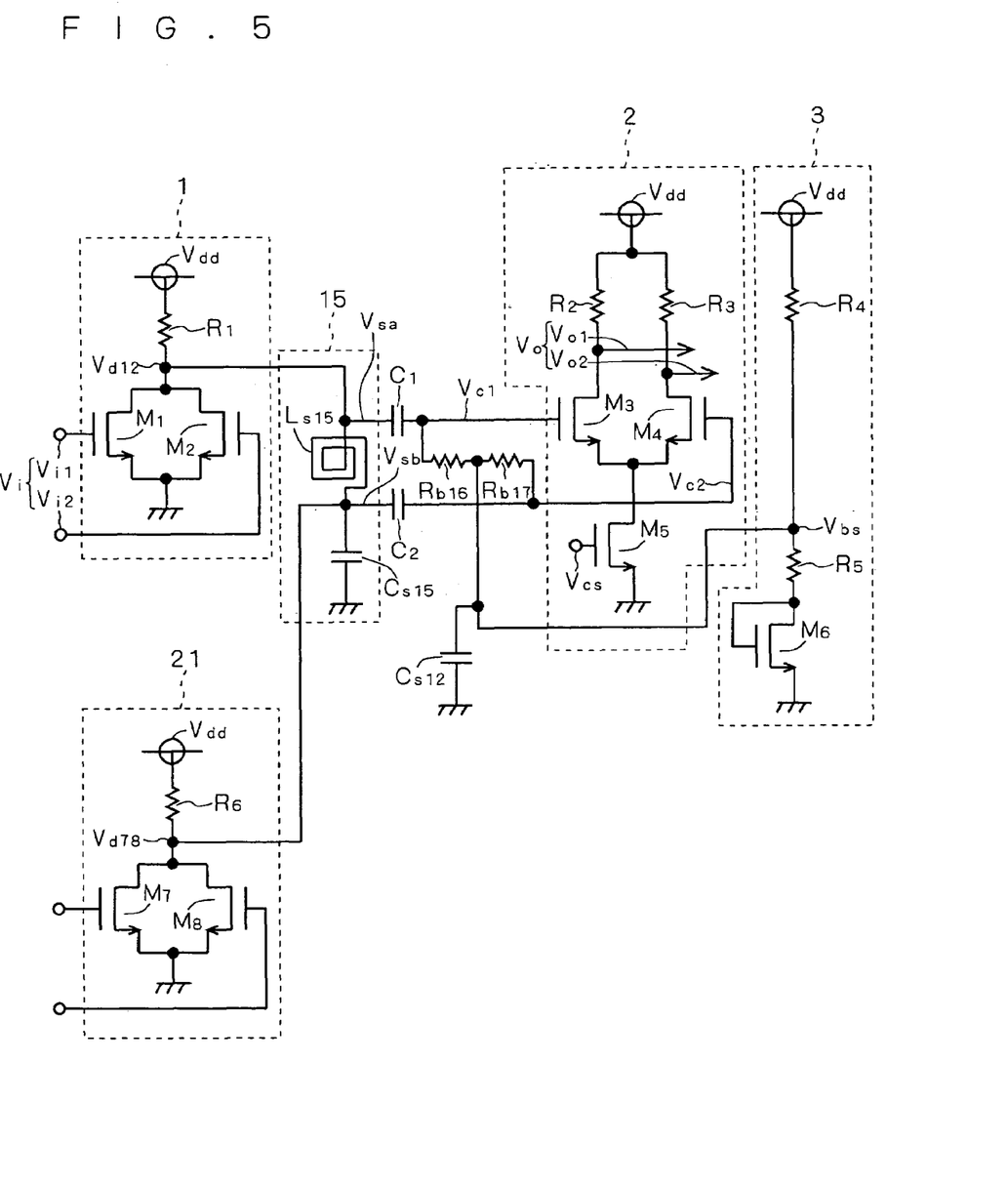
FIG. 5 is a circuit diagram showing a configuration of the frequency multiplier according to a fourth preferred embodiment of the present invention.

FIG. 5 is a circuit diagram showing a configuration of the frequency multiplier according to a fourth preferred embodiment of the present invention. The frequency multiplier according to the fourth preferred embodiment further includes a dummy multiplier core 21 in addition to the constituents of the frequency multiplier according to the third preferred embodiment.

The dummy multiplier core 21 includes a resistance element $R_6$ and nMOS transistors $M_7$ and $M_8$, and is identical in layout pattern with the multiplier core 1. Thus, the dummy multiplier core 21 and the multiplier core 1 are identical with each other not only in circuit configuration but also in the shapes of active regions and gate electrodes of the nMOS transistors thereof, the shapes of the resistance elements, and the like.

In the dummy multiplier core 21, the drain terminals of the nMOS transistors $M_7$ and $M_8$ are connected to each other, and are connected through the resistance element $R_6$ to the power supply potential $V_{dd}$. The source terminals of the nMOS transistors $M_7$ and $M_8$ are connected to each other, and are connected to the ground potential. The drain terminals of the nMOS transistors $M_7$ and $M_8$ are connected to a point of connection between the inductor element $L_{s15}$ and the capacitance element $C_{s15}$ of the 90-degree phase shifter 15.

In the dummy multiplier core 21 according to the fourth preferred embodiment, no signals are inputted to the gate terminals of the nMOS transistors $M_7$ and $M_8$ serving as the input terminal of the dummy multiplier core 21, but the gate terminals of the nMOS transistors $M_7$ and $M_8$ are open. The dummy multiplier core 21 outputs the drain potential of the nMOS transistors $M_7$ and $M_8$ as an output signal $V_{d78}$. Because the drain terminals of the nMOS transistors $M_7$ and $M_8$ are connected to the point of connection between the inductor element $L_{s15}$ and the capacitance element $C_{s15}$, the output signal $V_{d78}$ from the dummy multiplier core 21 is superimposed on the distributed signal $V_{sb}$ of the 90-degree phase shifter 15, and the superimposed signal is inputted to the gate terminal of the nMOS transistor $M_4$ of the differential amplifier 2.

As described above, the output signal $V_{d78}$ from the dummy multiplier core 21 identical in layout pattern with the multiplier core 1 is inputted to the gate terminal of the nMOS transistor $M_4$ of the differential amplifier 2 in the frequency multiplier according to the fourth preferred embodiment. Thus, if the first and second input signals $V_{i1}$ and $V_{i2}$ enter the power supply line and the like, the fundamental component contained in the output signal $V_{d12}$ from the multiplier core 1 is inputted to the gate terminal of the nMOS transistor $M_3$ of the differential amplifier 2, and the fundamental component contained in the output signal $V_{d78}$ from the dummy multiplier core 21 is inputted to the gate terminal of the nMOS transistor $M_4$. The fundamental component contained in the output signal $V_{d12}$ can be canceled by the fundamental component contained in the output signal $V_{d78}$. This further suppresses the unwanted fundamental component appearing in the output signals $V_{o1}$ and $V_{o2}$ from the differential amplifier 2.

In the fourth preferred embodiment, the power supply potential $V_{dd}$ and the gate terminal of the nMOS transistor $M_3$ are connected to each other through the resistance element $R_1$ and the capacitance element $C_1$, and the power supply potential $V_{dd}$ and the gate terminal of the nMOS transistor $M_4$ are connected to each other through the resistance element $R_6$ and the capacitance element $C_2$. That is, the circuit configuration of a path for connecting the power supply potential $V_{dd}$ through the resistance element $R_1$ to the gate terminal of the nMOS transistor $M_3$ is identical with the circuit configuration of a path for connecting the power supply potential $V_{dd}$ through the resistance element $R_6$ to the gate terminal of the nMOS transistor $M_4$. Thus, the impedances of the two paths can approach each other. This reduces the phase difference between the fundamental component inputted from the power supply potential $V_{dd}$ through the resistance element $R_1$ to the gate terminal of the nMOS transistor $M_3$ and the fundamental component inputted from the power supply potential $V_{dd}$ through the resistance element $R_6$ to the gate terminal of the nMOS transistor $M_4$. Therefore, the frequency multiplier according to the fourth preferred embodiment reliably cancels the fundamental component contained in the output signal $V_{d12}$ by using the fundamental component contained in the output signal $V_{d78}$, thereby to reliably suppress the unwanted fundamental component appearing in the output signals $V_{o1}$ and $V_{o2}$ from the differential amplifier 2.

Fifth Preferred Embodiment

Figure 6:
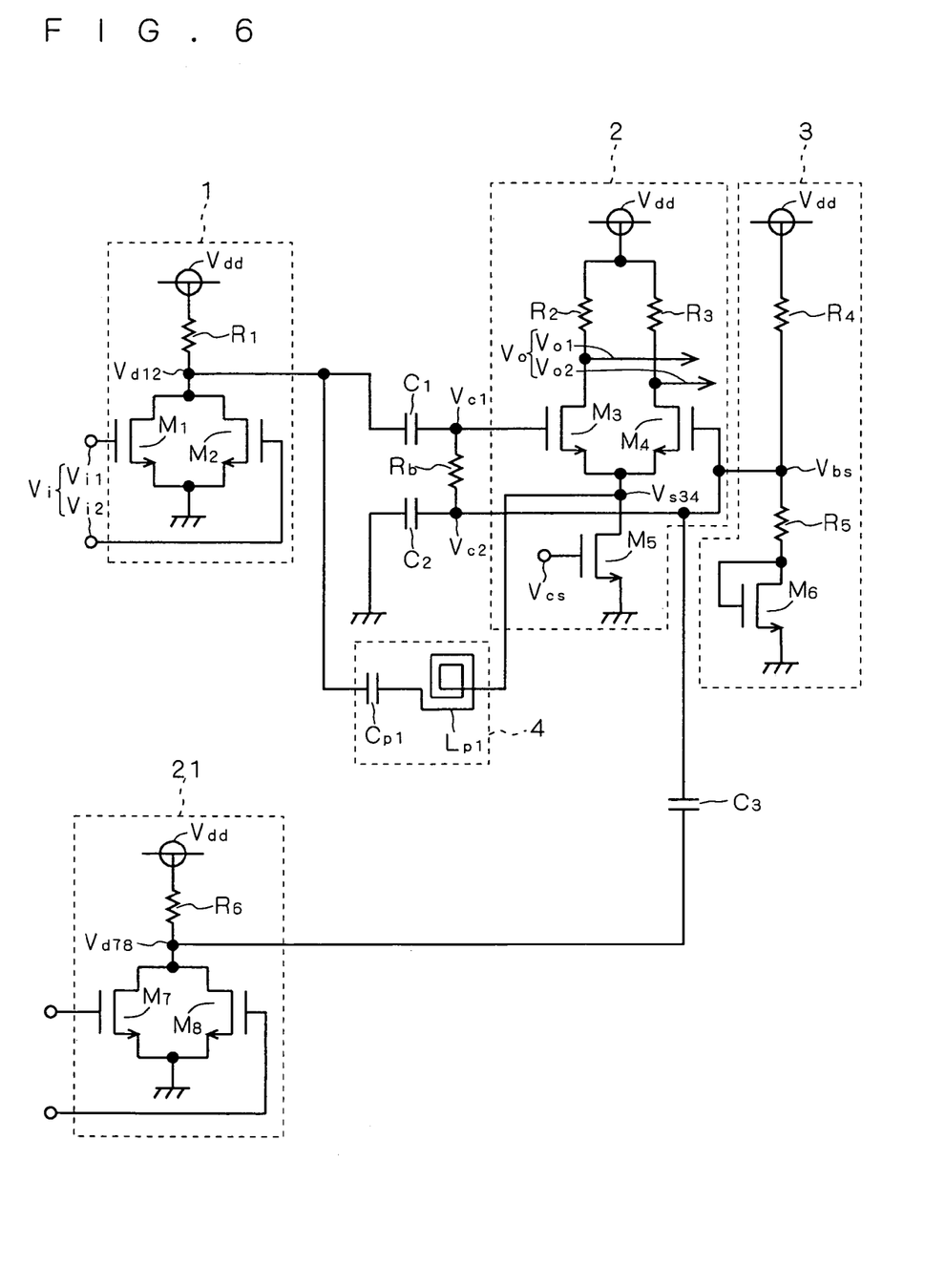
FIG. 6 is a circuit diagram showing a configuration of the frequency multiplier according to a fifth preferred embodiment of the present invention.

FIG. 6 is a circuit diagram showing a configuration of the frequency multiplier according to a fifth preferred embodiment of the present invention. The frequency multiplier according to the fifth preferred embodiment further includes the dummy multiplier core 21 of the fourth preferred embodiment in addition to the constituents of the frequency multiplier according to the first preferred embodiment.

In the dummy multiplier core 21 according to the fifth preferred embodiment, the drain terminals of the nMOS transistors $M_7$ and $M_8$ are connected through a capacitance element $C_3$ to the gate terminal of the nMOS transistor $M_4$ of the differential amplifier 2. Thus, the output signal $V_{d78}$ from the dummy multiplier core 21 is inputted to the gate terminal of the nMOS transistor $M_4$.

As described above, the output signal $V_{d78}$ from the dummy multiplier core 21 is inputted to the gate terminal of the nMOS transistor $M_4$ in the frequency multiplier according to the fifth preferred embodiment. Thus, if the first and second input signals $V_{i1}$ and $V_{i2}$ enter the power supply line and the like, the fundamental component contained in the output signal $V_{d12}$ from the multiplier core 1 is inputted to the gate terminal of the nMOS transistor $M_3$, and the fundamental component contained in the output signal $V_{d78}$ from the dummy multiplier core 21 is inputted to the gate terminal of the nMOS transistor $M_4$. The fundamental component contained in the output signal $V_{d12}$ can be canceled by the fundamental component contained in the output signal $V_{d78}$. This further suppresses the unwanted fundamental component appearing in the output signals $V_{o1}$ and $V_{o2}$ from the differential amplifier 2.

In the fifth preferred embodiment, the circuit configuration of the path for connecting the power supply potential $V_{dd}$ through the resistance element $R_1$ to the gate terminal of the nMOS transistor $M_3$ is also identical with the circuit configuration of the path for connecting the power supply potential $V_{dd}$ through the resistance element $R_6$ to the gate terminal of the nMOS transistor $M_4$. Thus, the impedances of the two paths can approach each other. This reduces the phase difference between the fundamental component inputted from the power supply potential $V_{dd}$ through the resistance element $R_1$ to the gate terminal of the nMOS transistor $M_3$ and the fundamental component inputted from the power supply potential $V_{dd}$ through the resistance element $R_6$ to the gate terminal of the nMOS transistor $M_4$. Therefore, the frequency multiplier according to the fifth preferred embodiment reliably cancels the fundamental component contained in the output signal $V_{d12}$ by using the fundamental component contained in the output signal $V_{d78}$, thereby to reliably suppress the unwanted fundamental component appearing in the output signals $V_{o1}$ and $V_{o2}$ from the differential amplifier 2.

Sixth Preferred Embodiment

Figure 7:
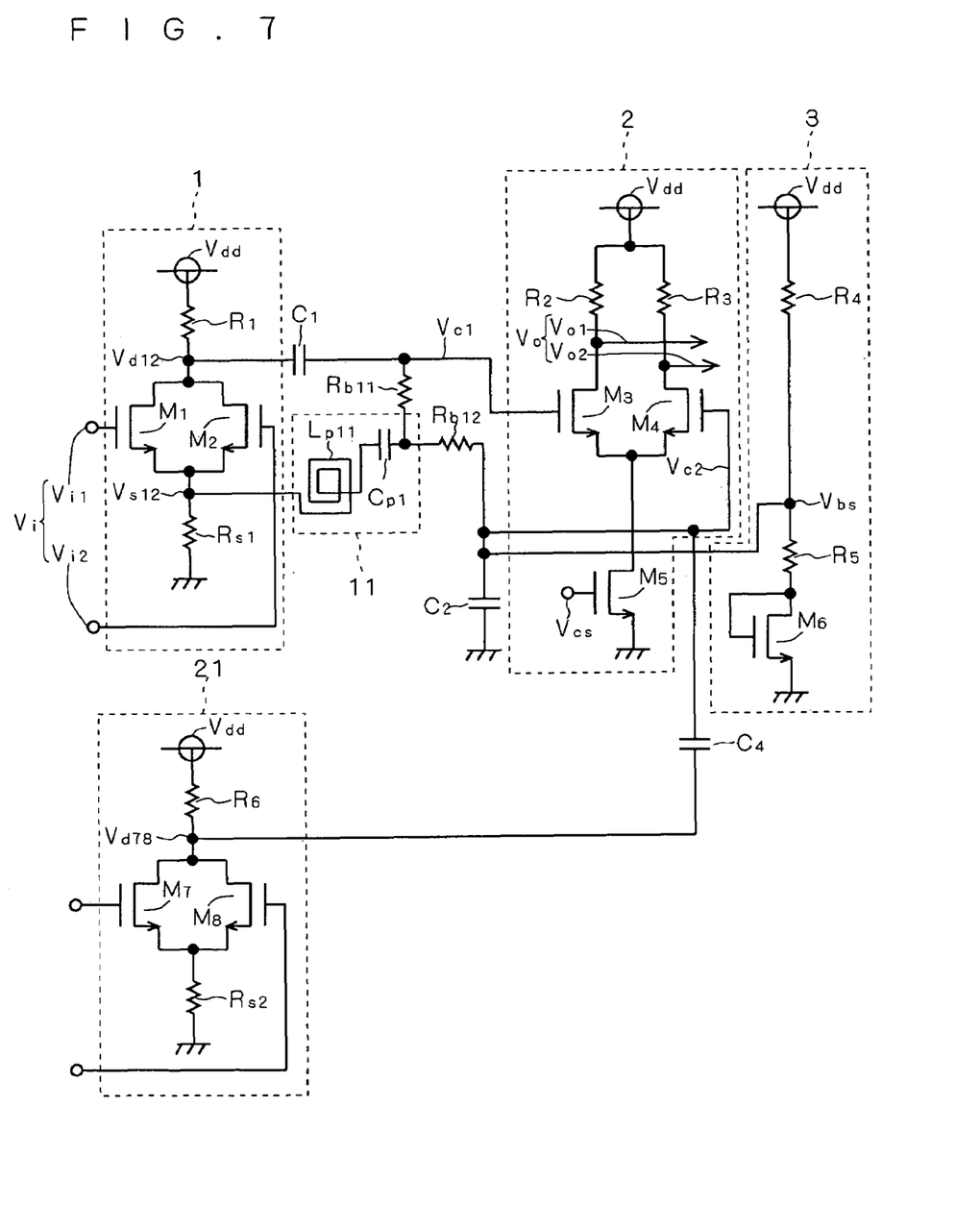
FIG. 7 is a circuit diagram showing a configuration of the frequency multiplier according to a sixth preferred embodiment of the present invention.

FIG. 7 is a circuit diagram showing a configuration of the frequency multiplier according to a sixth preferred embodiment of the present invention. The frequency multiplier according to the sixth preferred embodiment further includes the above-mentioned dummy multiplier core 21 in addition to the constituents of the frequency multiplier according to the second preferred embodiment. In the dummy multiplier core 21 according to the sixth preferred embodiment, the source terminals of the nMOS transistors $M_7$ and $M_8$ are connected through a resistance element $R_{s2}$ to the ground potential. The multiplier core 1 and the dummy multiplier core 21 shown in FIG. 7 are identical in layout pattern with each other.

In the dummy multiplier core 21 according to the sixth preferred embodiment, the drain terminals of the nMOS transistors $M_7$ and $M_8$ are connected through a capacitance element $C_4$ to the gate terminal of the nMOS transistor $M_4$ of the differential amplifier 2. Thus, the output signal $V_{d78}$ from the dummy multiplier core 21 is inputted to the gate terminal of the nMOS transistor $M_4$.

As described above, the frequency multiplier according to the sixth preferred embodiment is similar to the frequency multiplier according to the fifth preferred embodiment in that the output signal $V_{d78}$ from the dummy multiplier core 21 is inputted to the gate terminal of the nMOS transistor $M_4$. Thus, if the first and second input signals $V_{i1}$ and $V_{i2}$ enter the power supply line and the like, the fundamental component contained in the output signal $V_{d12}$ from the multiplier core 1 is inputted to the gate terminal of the nMOS transistor $M_3$, and the fundamental component contained in the output signal $V_{d78}$ from the dummy multiplier core 21 is inputted to the gate terminal of the nMOS transistor $M_4$. The fundamental component contained in the output signal $V_{d12}$ can be canceled by the fundamental component contained in the output signal $V_{d78}$. This further suppresses the unwanted fundamental component appearing in the output signals $V_{o1}$ and $V_{o2}$ from the differential amplifier 2.

In the sixth preferred embodiment, the circuit configuration of the path for connecting the power supply potential $V_{dd}$ through the resistance element $R_1$ to the gate terminal of the nMOS transistor $M_3$ is also identical with the circuit configuration of the path for connecting the power supply potential $V_{dd}$ through the resistance element $R_6$ to the gate terminal of the nMOS transistor $M_4$. This reduces the phase difference between the fundamental component inputted from the power supply potential $V_{dd}$ through the resistance element $R_1$ to the gate terminal of the nMOS transistor $M_3$ and the fundamental component inputted from the power supply potential $V_{dd}$ through the resistance element $R_6$ to the gate terminal of the nMOS transistor $M_4$. Therefore, the frequency multiplier according to the sixth preferred embodiment reliably cancels the fundamental component contained in the output signal $V_{d12}$ by using the fundamental component contained in the output signal $V_{d78}$, thereby to reliably suppress the unwanted fundamental component appearing in the output signals $V_{o1}$ and $V_{o2}$ from the differential amplifier 2.

In the sixth preferred embodiment, the circuit configuration of the first path for connecting the bias potential $V_{bs}$ to the gate terminal of the nMOS transistor $M_3$ differs from the circuit configuration of the second path for connecting the bias potential $V_{bs}$ to the gate terminal of the nMOS transistor $M_4$. However, the circuit configurations of the first and second paths may be made identical with each other by inserting resistance elements $R_{b13}$ and $R_{b14}$, as shown in FIG. 8.

Figure 8:
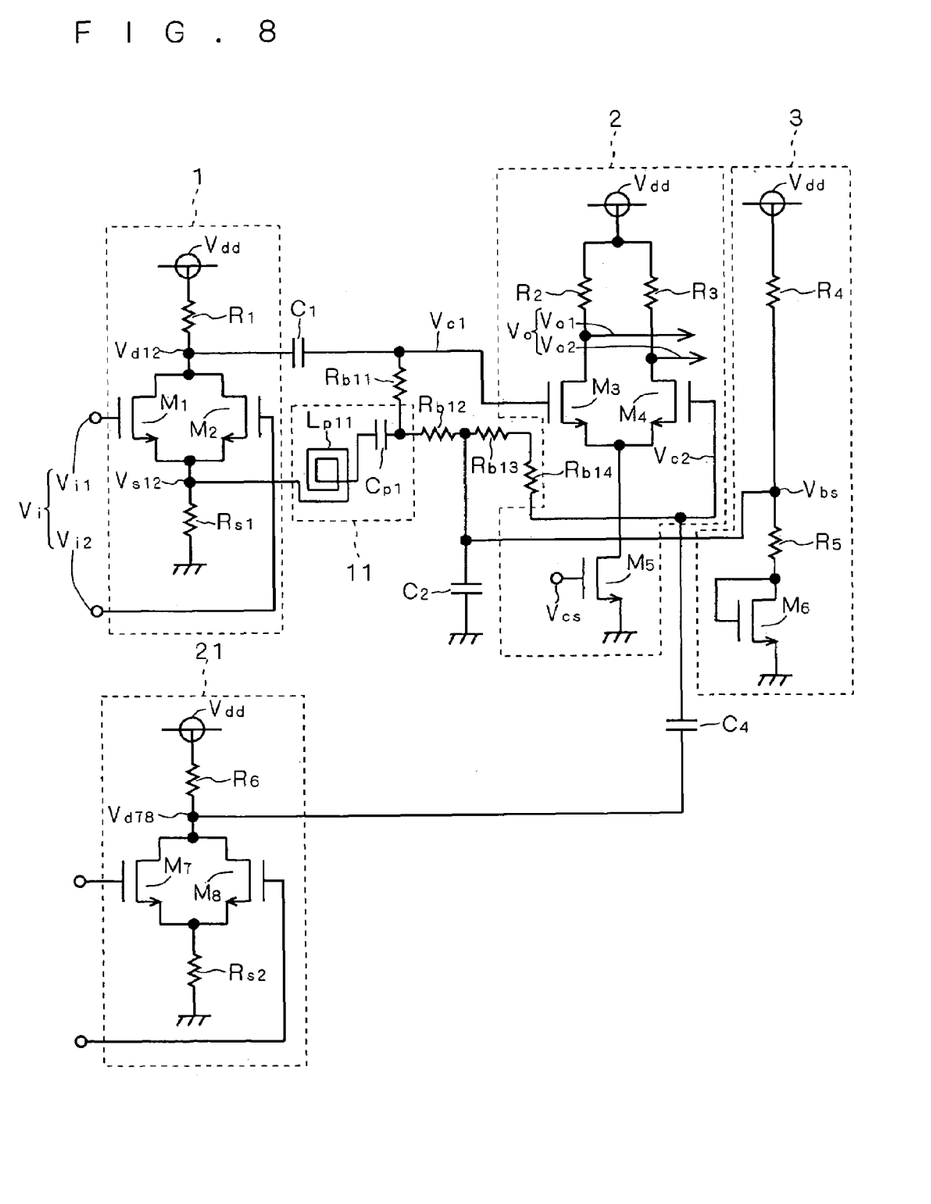
FIG. 8 is a circuit diagram showing a modification of the configuration of the frequency multiplier according to the sixth preferred embodiment.

In the circuit shown in FIG. 8, the gate terminals of the nMOS transistors $M_3$ and $M_4$ are connected through the resistance elements $R_{b11}$ to $R_{b14}$ connected in series with each other. The first end of the capacitance element $C_2$ is connected to a point of connection between the resistance elements $R_{b12}$ and $R_{b13}$, and the bias potential $V_{bs}$ is applied to the point of connection between the resistance elements $R_{b11}$ and $R_{b12}$. Thus, the bias potential $V_{bs}$ is applied through the resistance elements $R_{b13}$ and $R_{b14}$ to the gate terminal of the nMOS transistor $M_4$, and is applied through the resistance elements $R_{b11}$ and $R_{b12}$ to the gate terminal of the nMOS transistor $M_3$. As a result, the circuit configuration of the first path for connecting the bias potential $V_{bs}$ to the gate terminal of the nMOS transistor $M_3$ is identical with the circuit configuration of the second path for connecting the bias potential $V_{bs}$ to the gate terminal of the nMOS transistor $M_4$. This reduces the phase difference between the fundamental components inputted to the gate terminals of the nMOS transistors $M_3$ and $M_4$ by way of the bias circuit 3. Therefore, the circuit shown in FIG. 8 more reliably removes the fundamental component inputted to the differential input terminal of the differential amplifier 2 due to the fundamental component contained in the bias potential $V_{bs}$ than the circuit shown in FIG. 7, thereby to further suppress the fundamental component appearing in the output signals from the differential amplifier 2.

Although the MOS transistors are used as the transistors in the above-mentioned first to sixth preferred embodiments, bipolar transistors or GaAs MESFETs may be used in place of the MOS transistors to produce similar effects.

While the invention has been described in detail, the foregoing description is in all aspects illustrative and not restrictive. It is understood that numerous other modifications and variations can be devised without departing from the scope of the invention.

What is claimed is:

1. A frequency multiplier comprising:
   a multiplier core for outputting a single-phase output signal containing a frequency component having a first frequency that is an even multiple of the frequency of an input signal;
   a differential amplifier including a first input terminal receiving the output signal from said multiplier core, and a second input terminal grounded through a capacitor, said differential amplifier differentially amplifying the output signal from said multiplier core and a signal at said second input terminal and providing a differential output; and
   a series LC circuit, wherein
      said differential amplifier includes first and second transistors, each of said first and second transistors having a first current terminal, a second current terminal, and a control terminal,
      said second current terminals of said first and second transistors are connected to each other,
      said control terminal of said first transistor is said first input terminal of said differential input amplifier,
      said control terminal of said second transistor is said second input terminal of said differential input amplifier, and
      said multiplier core has an output terminal connected through said series LC circuit to said second current terminals of said first and second transistors of said differential amplifier.

2. The frequency multiplier according to claim 1, including a variable resistance element, wherein said output terminal of said multiplier core is connected through said variable resistance element to said second current terminals of said first and second transistors of said differential amplifier.

3. The frequency multiplier according to claim 1, wherein said series LC circuit includes a variable capacitance element.

4. The frequency multiplier according to claim 1, further comprising:
a dummy multiplier core identical in layout pattern to said multiplier core, said dummy multiplier core and said multiplier core being connected to a common power supply potential, wherein
said multiplier core includes a first resistance element,
said dummy multiplier core includes a second resistance element,
each of said multiplier core and said dummy multiplier core include third and fourth transistors, each of said third and fourth transistors having a first current terminal and a second current terminal,
said first current terminals of said third and fourth transistors in each of said multiplier core and said dummy multiplier core are connected to each other, said first current terminals of said third and fourth transistors in each of said multiplier core and said dummy multiplier core are connected through said first and second resistance elements, respectively, to said the power supply potential,
each of said multiplier core and said dummy multiplier core output a potential at said first current terminals of said third and fourth transistors, and
said dummy multiplier core provides an output signal input said second input terminal of said differential amplifier.

5. The frequency multiplier according to claim 4, wherein a first path connecting the power supply potential through said first resistance element to said first input terminal is a circuit which is identical with respect to number of electrical elements and electrical characteristics of the electrical elements to a circuit of a second path connecting the power supply potential through said second resistance element to said second input terminal.

6. The frequency multiplier according to claim 1, further comprising a bias circuit for supplying a bias potential to said first and second input terminals, wherein a first path connecting the bias potential to said first input terminal is a circuit which is identical with respect to number of electrical elements and electrical characteristics of the electrical elements to a circuit of a second path connecting the bias potential to said second input terminal.

7. A frequency multiplier comprising:
a multiplier core including first and second resistance elements and first and second transistors, each of said first and second transistors having a first current terminal, a second current terminal, and a control terminal, said multiplier core outputting a single-phase output signal containing a frequency component having a first frequency that is an even multiple of the frequency of an input signal;
a differential amplifier including a first input terminal receiving the output signal from said multiplier core, and a second input terminal grounded through a capacitor, said differential amplifier differentially amplifying the output signal from said multiplier core and a signal at said second input terminal and providing a differential output; and
a series LC circuit, wherein
said first current terminals of said first and second transistors of said multiplier core are connected to each other, said second current terminals of said first and second transistors of said multiplier core are connected to each other, said first current terminals of said first and second transistors of said multiplier core are connected through first resistance element to a power supply potential, and said second current terminals of said first and second transistors of said multiplier core are connected through said second resistance element to ground potential,
said multiplier core outputs a potential at said first current terminals of said first and second transistors, and
said second current terminals of said first and second transistors of said multiplier core are connected through said series LC circuit to said first input terminal of said differential amplifier.

8. The frequency multiplier according to claim 7, including a variable resistance element, wherein said second current terminals of said first and second transistors of said multiplier core are connected through said variable resistance element to said first input terminal of said differential amplifier.

9. The frequency multiplier according to claim 7, wherein said series LC circuit includes a variable capacitance element.

10. The frequency multiplier according to claim 7, further comprising;
a dummy multiplier core identical in layout pattern with said multiplier core, said dummy multiplier core and said multiplier core being connected to the power supply potential, wherein
said dummy multiplier core includes third and fourth resistance elements and third and fourth transistors, each of said third and fourth transistors having a first current terminal and a second current terminal,
said first current terminals of said third and fourth transistors in said dummy multiplier core are connected to each other, said second current terminals of said third and fourth transistors in said dummy multiplier core are connected to each other, said first current terminals of said third and fourth transistors in said dummy multiplier core are connected through said third resistance element to said power supply potential, and said second current terminals of said third and fourth transistors in said dummy multiplier core are connected through said fourth resistance element to ground potential,
said dummy multiplier core outputs a potential at said first current terminals of said third and fourth transistors, and
said dummy multiplier core provides an output signal input to said second input terminal of said differential input terminal.

11. The frequency multiplier according to claim 10, wherein a first path connecting the power supply potential through said first resistance element to said first input terminal is a circuit which is identical with respect to number of electrical elements and electrical characteristics of the electrical elements to a circuit of a second path connecting the power supply potential through said third resistance element to said second input terminal.

12. The frequency multiplier according to claim 7, further comprising a bias circuit for supplying a bias potential to said first and second input terminals, wherein a first path connecting the bias potential to said first input terminal is a circuit which is identical with respect to number of electrical elements and electrical characteristics of the electrical elements to a circuit of a second path connecting the bias potential to said second input terminal.

13. A frequency multiplier comprising:
 a multiplier core for outputting a single-phase output signal containing a frequency component having a first frequency that is an even multiple of the frequency of an input signal;
 a 90-degree phase shifter for distributing the output signal from said multiplier core as a first output signal and a second output signal; and
 a differential amplifier including a first input terminal receiving the first output signal, and a second input terminal receiving the second output signal, said differential amplifier differentially amplifying the first and second output signals and providing a differential output, wherein said 90-degree phase shifter distributes the frequency component contained in the output, signal from said multiplier core into two signals having opposite phases, and distributes a component other than the frequency component contained in the output signal from said multiplier core into two signals having the same phase.

14. The frequency multiplier according to claim 13, further comprising:
 a dummy multiplier core identical in layout pattern to said multiplier core, said dummy multiplier core and said multiplier core being connected to a common power supply potential, wherein
 said multiplier core includes a first resistance element, said dummy multiplier core includes a second resistance element,
 each of said multiplier core and said dummy multiplier core include third and fourth transistors, each of said third and fourth transistors having a first current terminal and a second current terminal,
 said first current terminals of said third and fourth transistors in each of said multiplier core and said dummy multiplier core are connected to each other, said first current terminals of said third and fourth transistors in each of said multiplier core and said dummy multiplier core are connected through said first and second resistance elements, respectively, to said the power supply potential,
 each of said multiplier core and said dummy multiplier core output a potential at said first current terminals of said third and fourth transistors, and
 said dummy multiplier core provides an output signal input said second input terminal of said differential amplifier.

15. The frequency multiplier according to claim 14, wherein a first path connecting the power supply potential through said first resistance element to said first input terminal is a circuit which is identical with respect to number of electrical elements and electrical characteristics of the electrical elements to a circuit of a second path connecting the power supply potential through said second resistance element to said second input terminal.

16. The frequency multiplier according to claim 13, further comprising a bias circuit for supplying a bias potential to said first and second input terminals, wherein a first path connecting the bias potential to said first input terminal is a circuit which is identical with respect to number of electrical elements and electrical characteristics of the electrical elements to a circuit of a second path connecting the bias potential to said second input terminal.

* * * * *